United States Patent
Rogojina et al.

(10) Patent No.: US 8,858,843 B2
(45) Date of Patent: Oct. 14, 2014

(54) HIGH FIDELITY DOPING PASTE AND METHODS THEREOF

(75) Inventors: Elena Rogojina, Los Altos, CA (US); Maxim Kelman, Mountain View, CA (US); Giuseppe Scardera, Sunnyvale, CA (US)

(73) Assignee: Innovalight, Inc., Sunnyvale, CA (US)

(*) Notice: Subject to any disclaimer, the term of this patent is extended or adjusted under 35 U.S.C. 154(b) by 559 days.

(21) Appl. No.: 12/967,654

(22) Filed: Dec. 14, 2010

(65) Prior Publication Data

US 2012/0145967 A1 Jun. 14, 2012

(51) Int. Cl.
| | |
|---|---|
| H01B 1/02 | (2006.01) |
| H01B 1/08 | (2006.01) |
| H01B 1/12 | (2006.01) |
| H01B 1/06 | (2006.01) |
| H01L 21/22 | (2006.01) |
| H01L 21/38 | (2006.01) |
| H01L 21/02 | (2006.01) |
| H01L 31/18 | (2006.01) |
| H01L 31/0288 | (2006.01) |
| H01L 31/032 | (2006.01) |
| H01L 31/0224 | (2006.01) |

(52) U.S. Cl.
CPC ......... *H01L 31/0288* (2013.01); *H01L 31/0321* (2013.01); *H01B 1/06* (2013.01); *H01L 31/022425* (2013.01); *Y02E 10/547* (2013.01); *H01L 31/1804* (2013.01); *H01B 1/12* (2013.01)
USPC ............. 252/518.1; 252/519.12; 252/519.14; 252/519.3; 252/519.34; 252/519.5; 252/519.52; 252/520.2; 252/521.1; 252/521.3; 252/521.4; 252/521.6; 438/542; 257/607

(58) Field of Classification Search
USPC ....................................................... 252/500
See application file for complete search history.

(56) References Cited

U.S. PATENT DOCUMENTS

| | | | |
|---|---|---|---|
| 4,891,331 A * | 1/1990 | Rapp ............................ | 438/563 |
| 6,695,903 B1 * | 2/2004 | Kubelbeck et al. ...... | 106/287.14 |
| 7,910,393 B2 | 3/2011 | Kim et al. | |
| 2005/0172998 A1 * | 8/2005 | Gee et al. ...................... | 136/261 |
| 2005/0234210 A1 * | 10/2005 | Andrianov et al. ........... | 528/168 |
| 2006/0084566 A1 * | 4/2006 | Wan et al. .................... | 501/96.2 |
| 2006/0231804 A1 * | 10/2006 | Wang et al. .................. | 252/500 |
| 2007/0215202 A1 * | 9/2007 | Salami et al. ................ | 136/256 |
| 2008/0150084 A1 * | 6/2008 | Hacke et al. ................. | 257/607 |
| 2008/0314288 A1 * | 12/2008 | Biro et al. .............. | 106/287.17 |
| 2009/0142911 A1 * | 6/2009 | Asano et al. ................. | 438/542 |
| 2010/0096014 A1 * | 4/2010 | Iida et al. ..................... | 136/265 |
| 2010/0275982 A1 | 11/2010 | Abbott et al. | |
| 2011/0045624 A1 * | 2/2011 | Tsukigata et al. ............ | 438/57 |

FOREIGN PATENT DOCUMENTS

| | | | | |
|---|---|---|---|---|
| EP | 1713092 A2 * | 10/2006 | ............... | H01B 1/22 |
| JP | 2010056465 A * | 3/2010 | | |

OTHER PUBLICATIONS

Edwards et al., "Screen-Print Selective Diffusions for High-Efficiency Industrial Silicon Solar Cells," Progress in Photovoltaics: Research and Applications, 2008, 16(1):31-45.
Olesinski et al., "The Ge-P (Germanium-Phosphorus) System," Bulletin of Alloy Phase Diagrams, 1985, 6(3):262-266.
Olesinski et al., "The B-Si (Broron-Silicon) System," Bulletin of Alloy Phase Diagrams, 1984, 5(5):478-484.
Tong et al., "Process and Film Characterization of PECVD Borophosphosilicate Films for VLSI Applications," Solid State Technology, Jan. 1984, 161-170.
Zaitsev et al., "Thermodynamic Properties and Phase Equilibria in the Si-B System," Journal of Phase Equilibria, 2001, 22(2):126-135.

\* cited by examiner

*Primary Examiner* — Harold Pyon
*Assistant Examiner* — Tanisha Diggs
(74) *Attorney, Agent, or Firm* — Foley & Lardner LLP (57) ABSTRACT

A high-fidelity dopant paste is disclosed. The high-fidelity dopant paste includes a solvent, a set of non-glass matrix particles dispersed into the solvent, and a dopant.

20 Claims, 13 Drawing Sheets

HIGH FIDELITY DOPING PASTE AND METHODS THEREOF

FIELD OF DISCLOSURE

This disclosure relates in general to semiconductors and in particular to a high fidelity doping paste and methods thereof.

BACKGROUND

Semiconductors form the basis of modern electronics. Possessing physical properties that can be selectively modified and controlled between conduction and insulation, semiconductors are essential in most modern electrical devices (e.g. computers, cellular phones, photovoltaic cells, etc.).

Typical solar cells are formed on a silicon substrate doped with a first dopant (the absorber region), upon which a second counter dopant is diffused using a gas or liquid process (the emitter region) completing the p-n junction. After the addition of passivation and antireflection coatings, metal contacts (fingers and busbar on the emitter and pads on the back of the absorber) may be added in order to extract generated charge carriers. Emitter dopant concentration, in particular, must be optimized for both carrier collection and for contact with the metal electrodes.

Electrons on the p-type side of the junction within the electric field (or built-in potential) tend to be attracted to the n-type region (usually doped with phosphorous) and repelled from the p-type region (usually doped with boron), whereas holes within the electric field on the n-type side of the junction may then be attracted to the p-type region and repelled from the n-type region. Generally, the n-type region and/or the p-type region can each respectively be comprised of varying levels of relative dopant concentration (e.g., phosphorous, arsenic, antimony, boron, aluminum, gallium, etc.) often shown as n−, n+, n++, p−, p+, p++, etc. The built-in potential and thus magnitude of electric field generally depend on the level of doping between the adjacent layers.

In some solar cell architectures, it may be beneficial to alter the type and concentration of a dopant as a function of substrate position. For example, for a selective emitter solar cell, a low concentration of (substitutional) dopant atoms within an emitter region will result in both low recombination (thus higher solar cell efficiencies), and poor electrical contact to metal electrodes. Conversely, a high concentration of (substitutional) dopant atoms will result in both high recombination (thus reducing solar cell efficiency), and low resistance ohmic contacts to metal electrodes. One solution, typically called a dual-doped or selective emitter, is generally to configure the solar cell substrate with a relatively high dopant concentration in the emitter region beneath the set of front metal contacts, and a relatively low dopant concentration in the emitter region not beneath the set of front metal contacts. Differential doping may also be beneficial to other solar cell architectures where the dopant needs to be localized, such as a backside contact solar cell.

Figure 1:
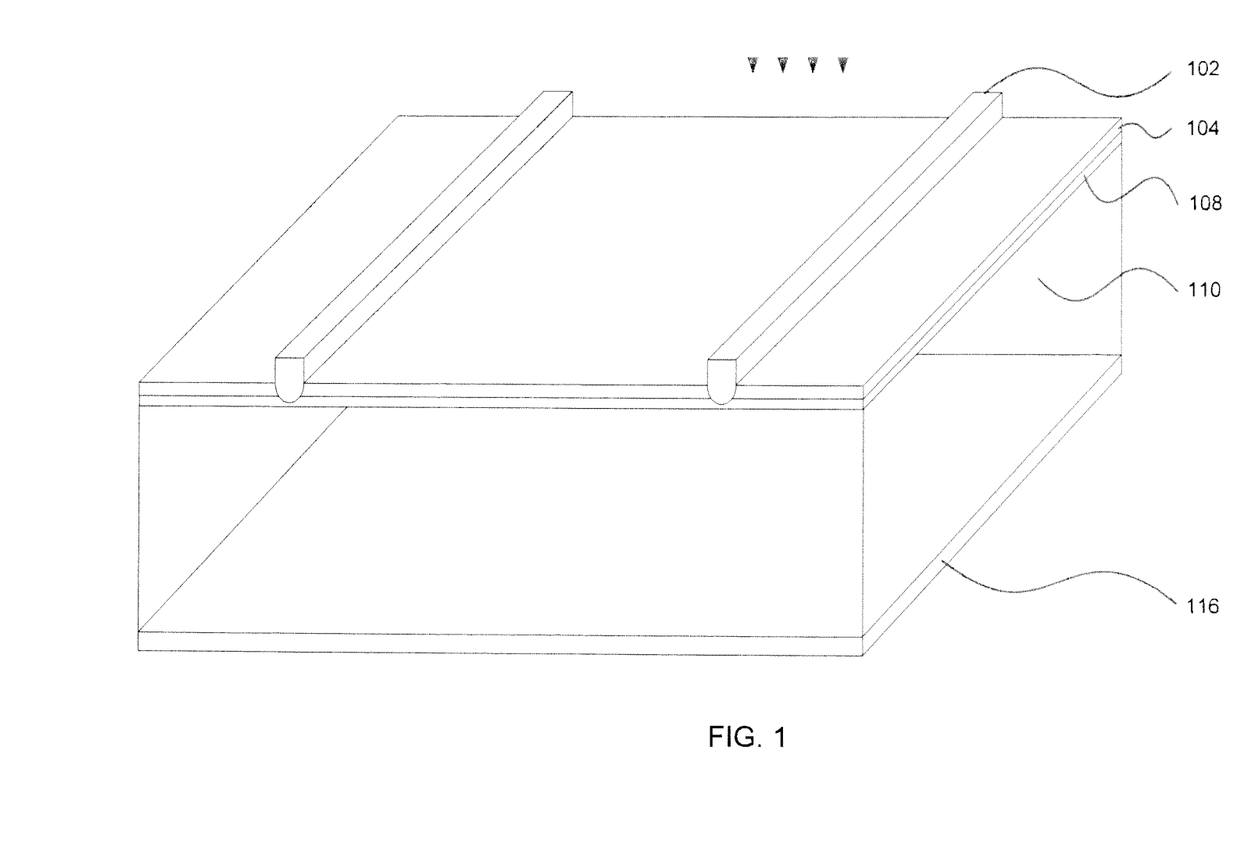
FIG. 1 shows a simplified diagram of a conventional solar cell.

Referring now to FIG. 1, a simplified diagram of a conventional solar cell is shown. In general, a moderately doped diffused emitter region 108 is generally formed above a relatively light and counter-doped diffused region absorber region 110. In addition, prior to the deposition of silicon nitride ($SiN_x$) layer 104 on the front of the substrate, the set of metal contacts, comprising front-metal contact 102 and back surface field (BSF)/back metal contact 116, are formed on and fired into silicon substrate 110.

In a common configuration, a light n-type diffused region 108 (generally called the emitter or field), is formed by exposing the boron-doped substrate to $POCl_3$ (phosphorus oxychloride) ambient to form phosphosilicate glass (PSG) on the surface of the wafer. The reduction of phosphorus pentoxide by silicon releases phosphorus into the bulk of the substrate and dopes it. The reaction is typically:

[Equation 1A]

[Equation 1B]

[Equation 2]

The $POCl_3$ ambient typically includes nitrogen gas ($N_2$ gas) which is flowed through a bubbler filled with liquid $POCl_3$, and a reactive oxygen gas (reactive $O_2$ gas) configured to react with the vaporized $POCl_3$ to form the deposition (processing) gas. In general, the reduction of $P_2O_5$ to free phosphorous is directly proportional to the availability of Si atoms.

Figure 2:
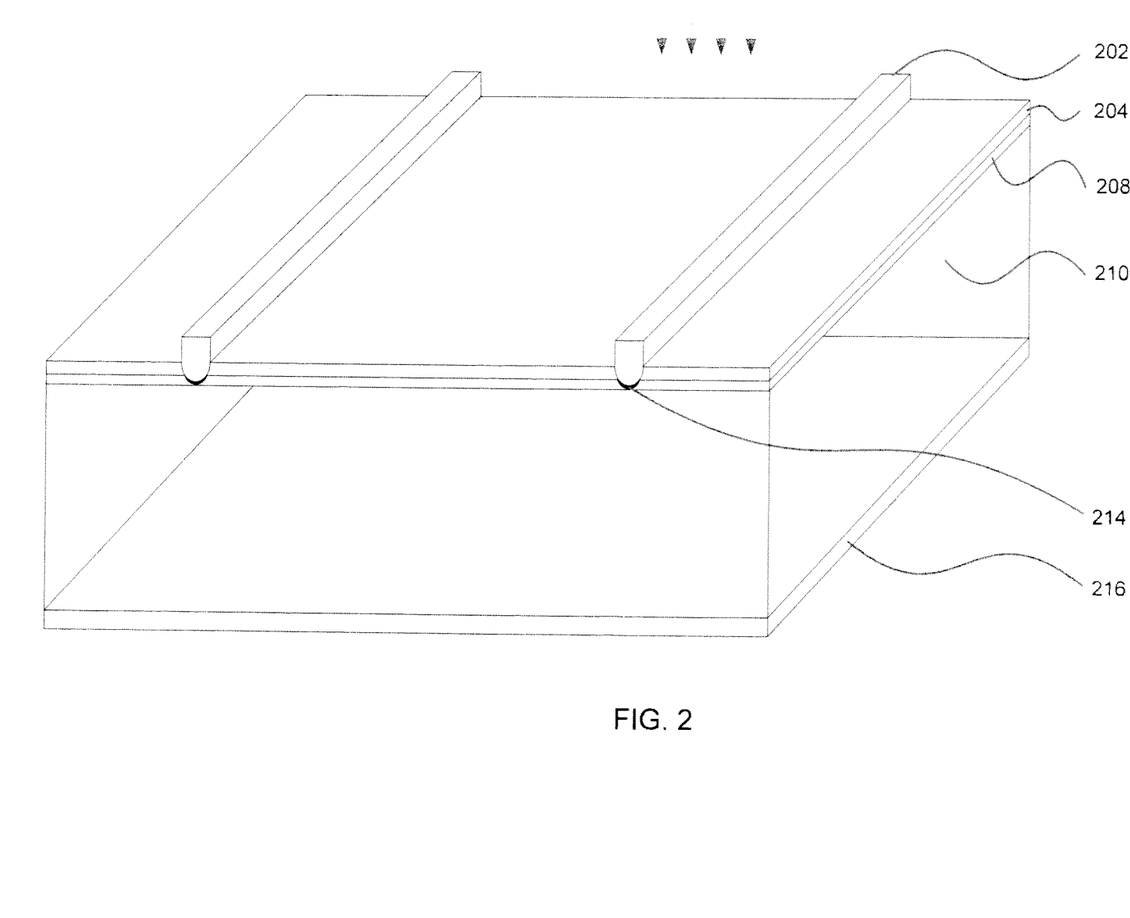
FIG. 2 shows a simplified diagram of a selective emitter solar cell.

Referring now to FIG. 2, a simplified diagram of a selective emitter is shown. In general, a relatively heavy n-type diffused region (high dopant concentration) 214 is generally formed in emitter areas beneath the set of front-metal contacts 202, while a relatively light n-type diffused region (low dopant concentration) 208 is generally formed in emitter areas not beneath the set of front-metal contacts 202. In addition, prior to the deposition of silicon nitride ($SiN_x$) layer 204 on the front of the substrate, the set of metal contacts, comprising front-metal contact 202 and back surface field (BSF)/back metal contact 216, are formed on and fired into silicon substrate 210. In a common configuration, light n-type diffused region 208 (generally called the emitter or field), is formed by exposing the boron-doped substrate to $POCl_3$ as previously described.

In an alternate configuration to those in FIGS. 1 & 2, the diffusion may be formed (or partially formed) using a doping paste directly deposited on the surface of the substrate, instead of through an ambient gas source. In general, an n-type or p-type dopant source is combined with some type of matrix material, preferably printable, that both provides the dopant source in a deposited pattern during the diffusion process, and is subsequently easily removed once the diffusion process has completed.

N-type doping pastes may include dopant precursors such as n-type liquids (i.e., phosphoric acid [$H_3PO_4$], organophosphates [$O=P(OR)_x(OH)_{3-x}$], etc.), n-type solids (i.e., $P_2O_5$, inorganic phosphates [$Na_3PO_4$, $AlPO_4$, etc.] and phosphides [AlP, $Na_3P$, etc.]), and n-type polymers (i.e., polyphosphonates, polyphosphazenes, etc.).

P-type doping pastes may include dopant precursors such as p-type liquids (i.e., borate esters [$B(OR)_3$]), p-type solids (i.e., boric acid [$B(OH)_3$], borates [$NaBO_2$, $Na_2B_4O_7$, $B_2O_3$]), p-type binary compounds (i.e., boronitride, boron carbide, boron silicides and elementary boron), and p-type polymers (i.e., polyborazoles, organoboron-silicon polymers, etc.).

An example of a common matrix material is a silica sol-gel. A "sol" is typically a stable suspension of colloidal particles within a liquid (2-200 nm), and a "gel" is a porous 3-dimensional interconnected solid network that expands in a stable fashion throughout a liquid medium and is limited by the size of the container.

In general, the sol-gel derived glass formation process involves first the hydrolysis of the alkoxide (sol formation), and second the polycondensation of hydroxyl groups (gelation). For a given silicon alkoxide of general formula $Si(OR)_4$, R being an alkyl chain, these reactions can be written as follows:

Hydrolysis $$Si(OR)_4 + H_2O \rightarrow (HO)Si(OR)_3 + R\text{—}OH \quad \text{[Equation 3]}$$

Condensation $$(H_O)_{Si}(OR)_3 + Si(OR)_4 \rightarrow (RO)_3Si\text{—}O\text{—}Si(OR)_3 + R\text{—}OH \quad \text{[Equation 4]}$$

$$(OR)_3Si(OH) + (HO)Si(OR)_3 \rightarrow (RO)_3Si\text{—}O\text{—}Si(OR)_3 + H_2O \quad \text{[Equation 5]}$$

For example, a sol-gel suspension (comprising silicon alkoxide) may be combined with an n-type precursor of phosphorus pentoxide ($P_2O_5$), like phosphoric acid ($H_3PO_4$), an organophosphate ($O\text{=}P(OR)_x(OH)_{3-x}$) etc. Likewise, p-type doping, the sol-gel suspension may be combined with a p-type precursor of boron trioxide ($B_2O_3$), like boric acid ($B(OH)_3$), boron alkoxides ($B(OR)_3$), etc. The resulting doped silicon glass (phosphoro-silicate glass (PSG) and boro-silicate glass (BSG) for n-type and p-type doping respectively) formed by condensation reaction during high temperature bake ($200°\ C. < T_{bake} < 500°\ C.$) is used for subsequent dopant diffusion process.

However, the use of a sol-gel doping paste may be problematic for selective doping due to relatively low glass transition temperature of doped silicon glasses. Additionally, the glass transition temperature tends to decrease significantly with an increasing dopant contencentration corresponding to increasing atomic disorder of the silica layer. See J. W. Morris, Jr., Chapter 5: Glasses, Engineering 45 Notes, Fall 1995, UC Berkeley.

The glass transition temperature of doped silica glass formed from a typical doping paste is substantially below temperature needed to drive the dopant into the silicon substrate. As a result, the doped silica glass tends to reflow during high temperature processing resulting in spreading of the dopant source on the surface. While not problematic (and perhaps even beneficial) for the blanket doping of large substrates surfaces, the use of a doping process that produces a silicon glass is problematic for the forming of high-fidelity doping regions, such as would be required under the front metal fingers to form an ohmic contact.

In addition, many typical sol-gel doping pastes have suboptimal screen printing characteristics. In general, in order to be commercially viable in high-volume solar cell production with a high printing resolution, a paste used in a screen printer must be a non-Newtonian shear-thinning fluid. Non-Newtonian fluid refers to a fluid whose flow properties are not described by a single constant value of viscosity. Shear thinning refers to a fluid whose viscosity decreases with increasing rate of shear stress.

Consequently, the viscosity of the paste must be relatively low at high shear rates in order to pass through a screen pattern, but must be relatively high prior to and after deposition (at low or zero shear rates), in order not to run through the screen or on the substrate surface respectively. However, many typical sol-gel doping pastes exhibit a near-Newtonian behavior, which means that they are either too viscous to effectively pass through a screen, or not viscous enough to prevent running, which corresponds to a low fidelity deposited pattern.

In view of the foregoing, there is desired a doping paste with a glass transition temperature substantially greater than the relevant doping temperature.

SUMMARY

The invention relates, in one embodiment, to a high-fidelity dopant paste. The high-fidelity dopant paste includes a solvent, a set of non-glass matrix particles dispersed into the solvent, and a dopant.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In an advantageous manner, a high-fidelity doped pattern may be formed on the substrate by a high fidelity doping paste that includes a dopant source(precursor) and a set of matrix particles with a high melting temperature (i.e., substantially greater than the diffusion temperature). In one configuration, the set of matrix particles comprises non-glass forming particles.

In another configuration, the set of matrix particles is dispersed in a solvent with a boiling point above 200° C. Examples of such solvents include, solvents with a linear or cyclic structures, solvents with saturated or unsaturated hydrocarbon parts, hydrocarbon-based solvents (i.e. alkane, alkene, alkyne), alcohols, thiols, ethers, esters, aldehydes, ketones, or a solvent with combinations of thereof.

In another configuration, the average diameter of the set of matrix particles is less than 25 microns. In another configuration, a binder is also added to the solvent. In another configuration, the binder is one of a polyacrylate, a polyacetal, a polyvinyl, a cellulose (including its ethers and esters), and copolymers thereof.

In general, a typical dopant drive in temperature is between about 800° C. and about 1050° C. (i.e., the temperature at which the corresponding dopant is driven into the substrate for substitutional bonding in the crystalline silicon). Consequently, the melting temperature of the non-glass matrix material should be greater than 1050° C. in order to minimize any change in shape or resolution of the deposited pattern during the diffusion process. Examples of non-glass matrix particles include ceramics (i.e., $Al_2O_3$, MgO, $CeO_2$, TiO2, $Y_2O_3$, ZnO, $ZrO_2$, $ZrO_{2-3}$, $Y_2O_3$), W and WC, and elemental compounds like Carbon and Silicon.

The addition of a dopant precursor, as previously described, has minimal effects on the melting temperature of non-glass matrix particles. For example, crystalline silicon has high melting temperature of about 1440° C., and the incorporation of boron up to the solid solubility limit can only reduce the melting point to between 50-80° C. [R. W. Olesinski and G. J. Abbaschian, The B—Si System, *Bull. Alloy. Phase Diagrams*, 5 (no. 5), 1984, p 478-484; A. I. Zaitsev and A. A. Koentsov, Thermodynamic Properties and Phase Equilibria in the Si—B System *J. Phase Equilib.* 22 (no. 2), 2001, p 126-135]. Likewise, incorporating phosphorous atoms into the silicon substrate matrix (again up to the solid solubility limit) tends to reduce the melting temperature to 1180° C. [R. W. Olesinski, N. Kanani, G. J. Abbaschian, The P—Si System, *Bull. Alloy Phase Diagrams* 6 (no. 3), 1985].

In addition, unlike typical sol-gel doping pastes, a high-fidelity doping paste that comprises micron and sub-micron particle sizes also tends to exhibit strong shear-thinning (non-Newtonian) behavior. A previously described, non-Newtonian fluid refers to a fluid whose flow properties are not described by a single constant value of viscosity. Shear thinning refers to a fluid whose viscosity decreases with increasing rate of shear Referring now to FIGS. 3A-D, a set of simplified diagrams is shown, comparing the reflow on a silicon substrate of a set of doped glasses (as used in a conventional doping paste) to a high-fidelity doping paste comprising a silicon ink, in accordance with the invention. In general, a silicon ink, is a non-Newtonian silicon nanoparticle colloidal dispersion. More detailed information is described in U.S. patent application Ser. No. 12/493,946 entitled Sub-Critical Shear Thinning Group IV Based Nanoparticle Fluid, filed on Jun. 29, 2009, the entire disclosure of which is incorporated by reference.

Figure 3A:
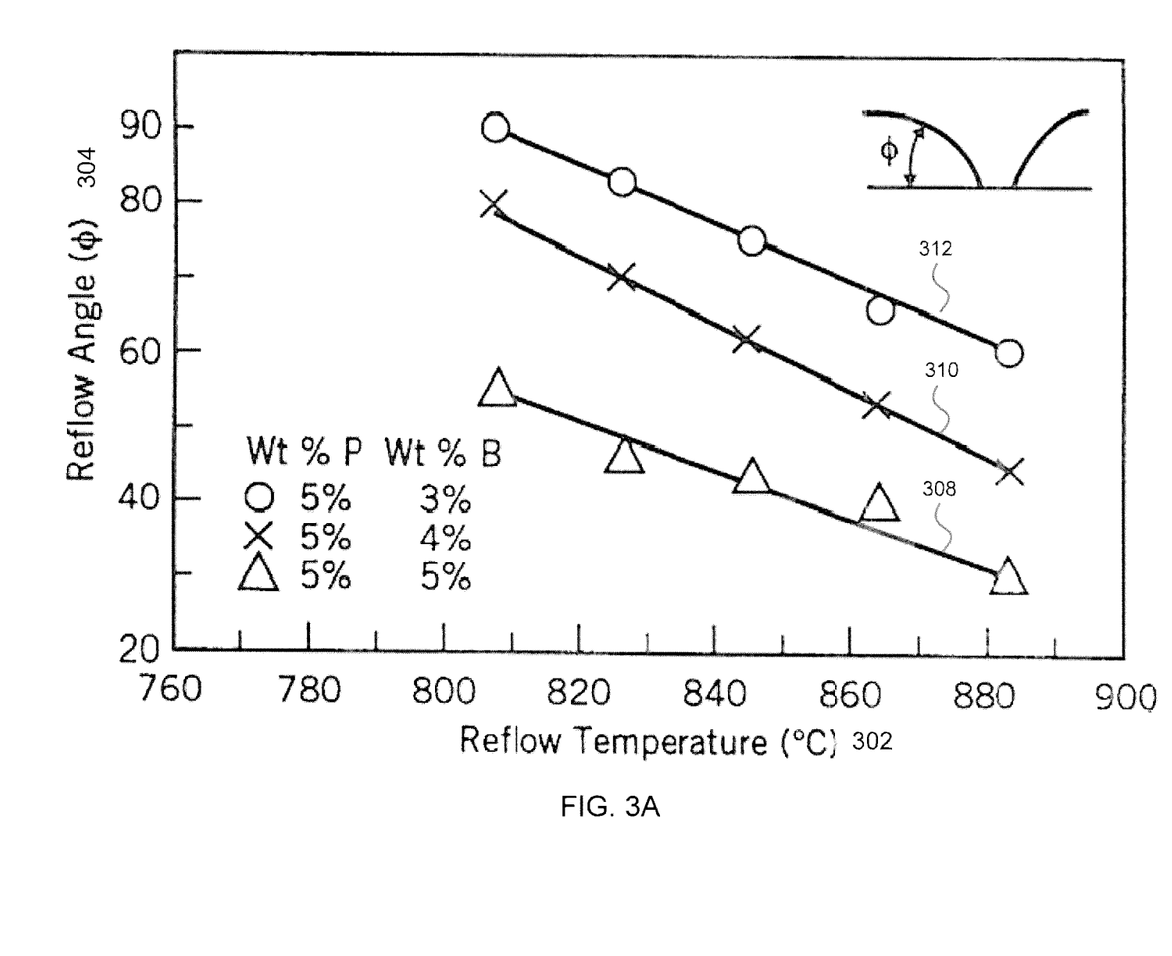
FIGS. 3A-D show a set of simplified diagrams comparing the reflow on a silicon substrate of a set of doped glasses to a silicon ink.

FIG. 3A compares the reflow angle φ to the reflow temperature ° C. for a set of doped glasses. Reflow temperature in ° C. is shown along the horizontal axis 302, while reflow angle φ is shown along the vertical axis. Upon deposition, a reflow angle φ is formed between the air-glass boundary and the glass-substrate boundary of the fluid. By definition, as a fluid spreads out, the corresponding reflow angle φ decreases.

Doped silicon glasses are deposited and then heated from about 810° C. to about 890° C. A first silicon glass 308 is comprised of 5% phosphorous and 3% boron. A second silicon glass 310 is comprised of 5% phosphorous and 4% boron. A third silicon glass 312 is comprised of 5% phosphorous and 5% boron. As can be seen, for any given temperature in the flow range of 810° C. to about 890° C., a higher dopant concentration corresponds to a smaller reflow angle φ. That is, to higher wetting on the substrate surface and degradation of pattern fidelity.

Figure 3B:
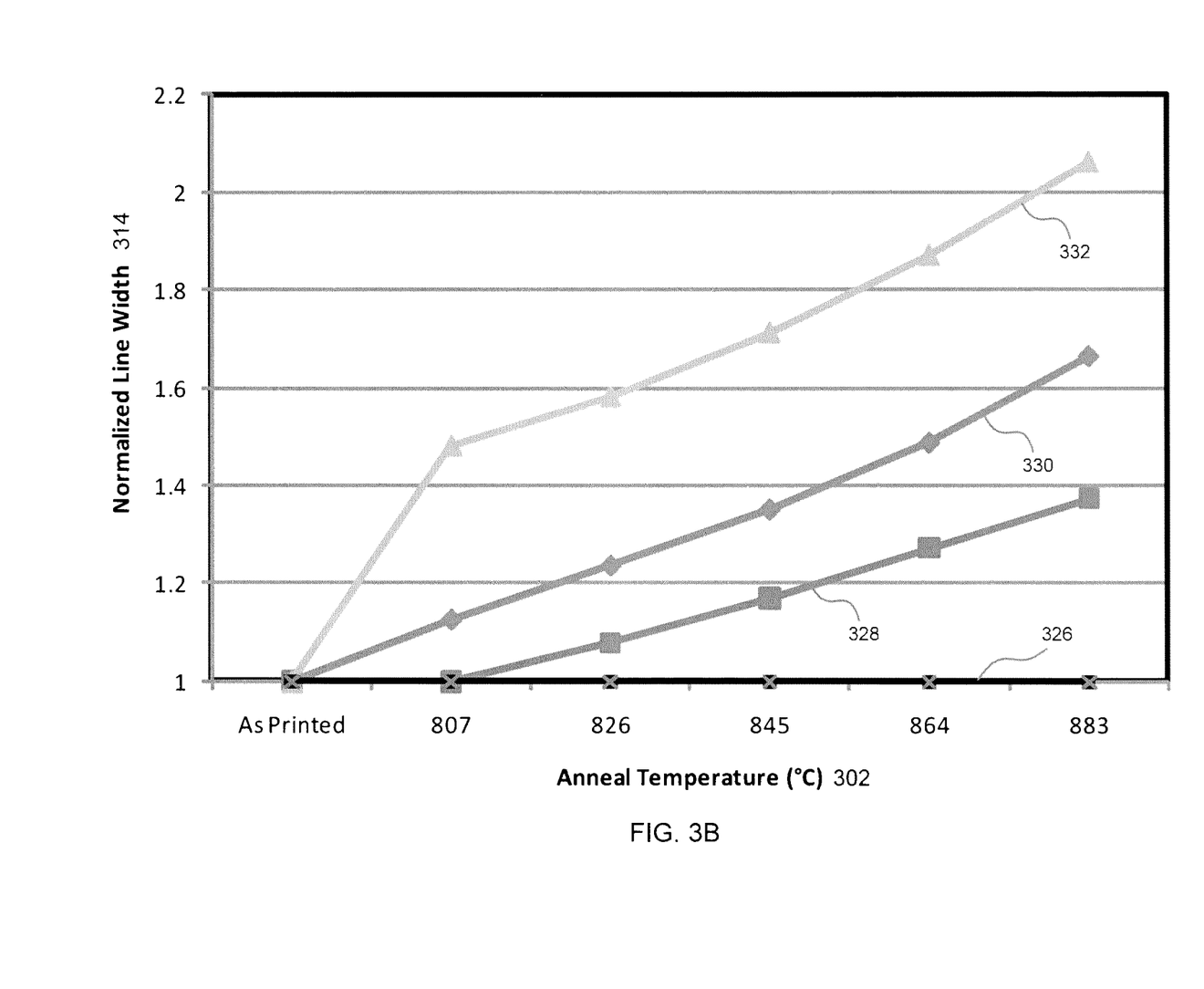

FIG. 3B compares the normalized line width for the same set of doped glasses with doped silicon ink, in accordance with the invention. The derivation of normalized line width from reflow angle is described in FIG. 3C below.

A first silicon glass 328 is comprised of 5% phosphorous and 3% boron. A second silicon glass 330 is comprised of 5% phosphorous and 4% boron. A third silicon glass 332 is comprised of 5% phosphorous and 5% boron. In addition, a silicon ink 326 is comprised of a 10% phosphorous dopant concentration.

As in FIG. 3A, for the set of glasses across any given temperature in the flow range of 810° C. to about 890° C., a higher dopant concentration corresponds to a higher difference in normalized line width. However, in an advantageous manner, the silicon ink 326 shows no substantive change in normalized line width across the same temperature range.

Figures 3C, 3D:
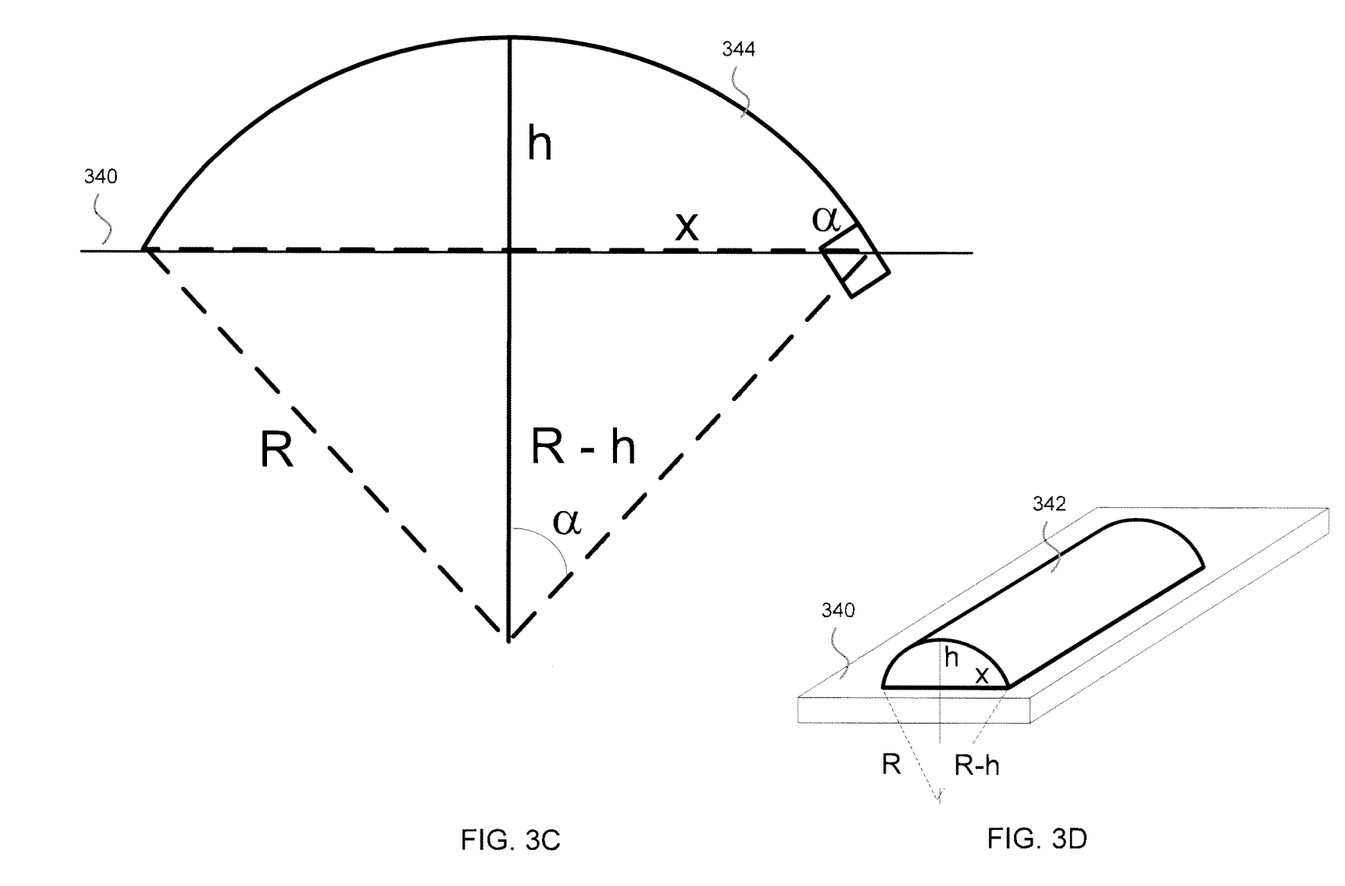

FIGS. 3C-D derive the conversion from reflow angle to normalized line width. See J. E. Tong, et al., Solid State Tech., January 1984, p 161. In general, a deposited fluid droplet 344, such as a deposited paste or silicon ink, may be modeled as a lateral slice 342 of a cylinder. The following derivation shows the conversion of reflow angle φ in FIG. 3A to nominal line width 314 in FIG. 3B.

Modeling the shape of the deposited fluid as a slice of a cylinder, radius R may be calculated.

$$A = \pi R^2 \cdot \left(\frac{2\alpha}{2\pi}\right) = \alpha R^2 \qquad \text{[Equation 6A]}$$

$$A = \frac{x \cdot (R-h)}{2} \qquad \text{[Equation 6B]}$$

$$x = R \cdot \sin\alpha$$

$$A = \left(\frac{R \cdot \sin\alpha \cdot (R-h)}{2}\right) = \frac{R^2 \cdot \sin\alpha \cdot \cos\alpha}{2} \qquad \text{[Equation 6C]}$$

$$A = R^2 \sin\alpha \cos\alpha \qquad \text{[Equation 6D]}$$

$$A = \alpha R^2 - R^2 \sin\alpha \cos\alpha \qquad \text{[Equation 6E]}$$

$$R = \left(\frac{1}{\alpha - \sin\alpha \cos\alpha}\right)^{1/2} \qquad \text{[Equation 6F]}$$

$$X = R\sin\alpha = \left(\frac{1}{\alpha - \sin\alpha \cos\alpha}\right)^{1/2} \cdot \sin\alpha \qquad \text{[Equation 6G]}$$

Rheology Comparison

Experiment 1

Figure 4A:
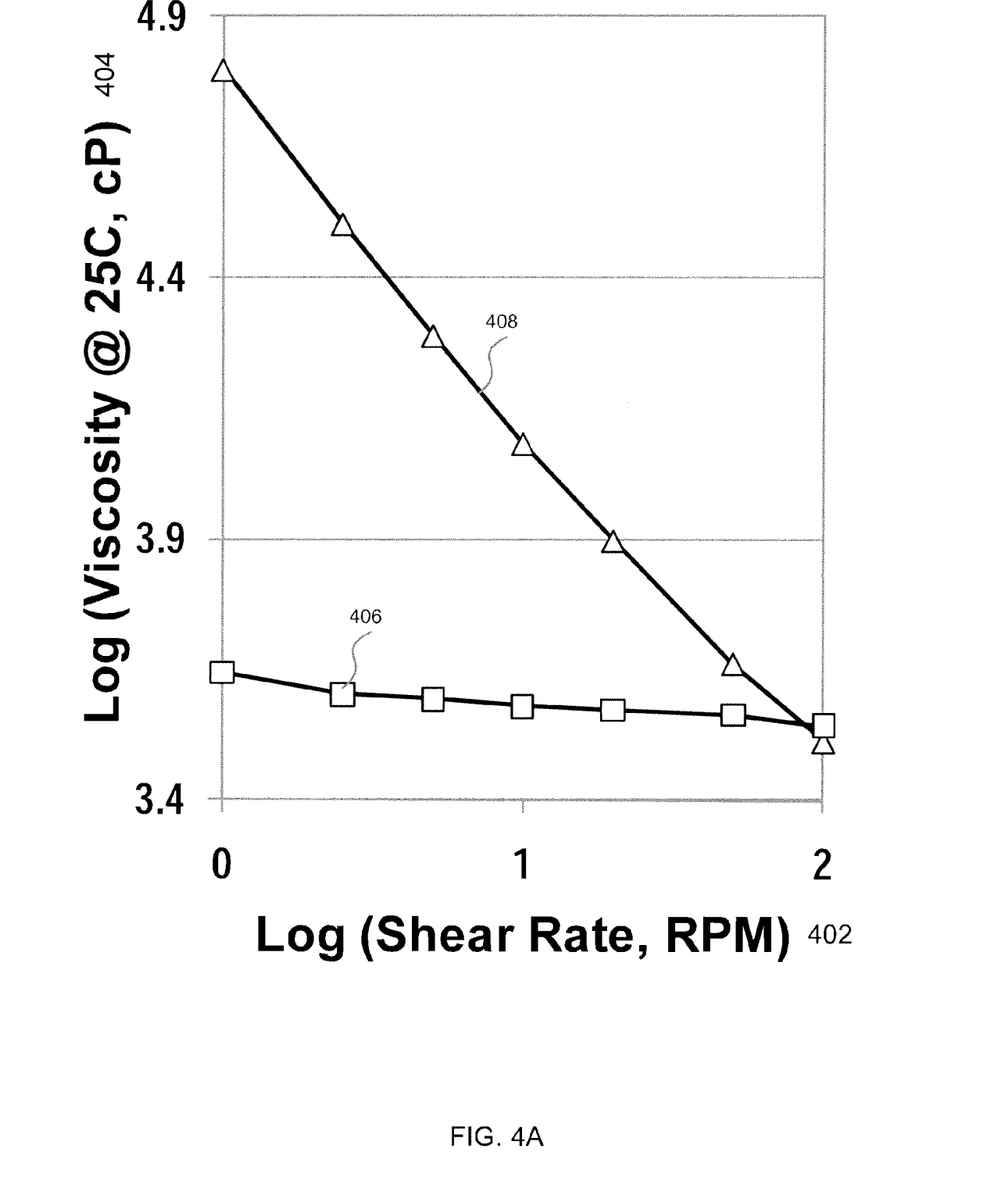
FIGS. 4A-B compare the viscosity vs. shear rate, and the resulting line width after deposition with the same screen, for both a n-type conventional doping paste and a n-type high fidelity doping paste, in accordance with the invention.
Figure 4B:
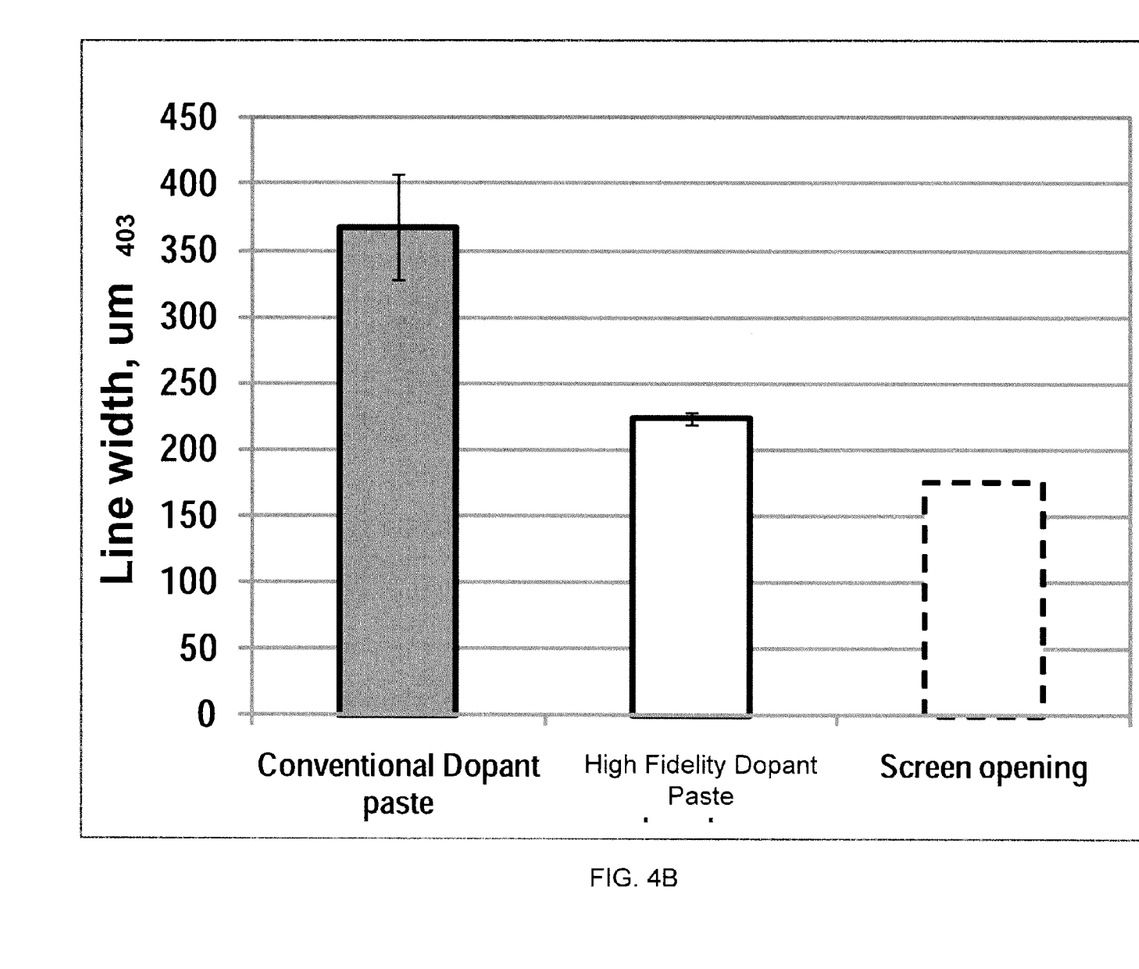

Referring now to FIGS. 4A-B, set of simplified diagrams compare a conventional doping paste to the high-fidelity doping paste, in accordance with the invention.

FIG. 4A shows viscosity vs. shear rate for both an n-type Ferro doping paste 406 (glass) and a n-type silicon ink based high-fidelity doping paste 408 (non-glass), in accordance with the invention. Log of Shear rate in 1/sec 402 is shown along the horizontal axis, while Log of Viscosity 404 measured in cP at 25° C., is shown along the vertical axis. Viscosity was measured as a function of shear rate to show the influence of silicon nanoparticles on the flow behavior of the paste. As can be seen, conventional doping paste 406 shows typical near-Newtonian behavior due to low surface interaction of the sol particles. Thus, the viscosity of the fluid change slightly under differing shear rate. However, silicon ink based high-fidelity doping paste 408, characterized by significant particle-particle interaction, shows a much stronger shear thinning behavior. Increased shear thinning behavior results in better ink flow through the screen with reduced spreading of printed features on the target surface, as it can be seen in FIG. 4B.

FIG. 4B. shows line width 403 for conventional Ferro n-type paste and silicon ink based high-fidelity doping paste after deposition with the same screen. Two p-type substrates were each cleaned with a hydrofluoric acid/hydrochloric acid mixture prior to paste deposition. Both pastes were deposited with a screen mask opening of 175 µm, and were then baked at 200° C. for a time period of about 3 minutes in order to remove solvents and densify the deposited paste. As can be seen, the high fidelity doping paste can be deposited with a smaller absolute line width than the conventional doping paste due to stronger shear thinning behavior. The median line width is about 365 µm for the conventional doping paste vs. a median line width of 224 um for high fidelity doping paste. As compared to the finger opening of 175 µm, the high fidelity paste spreads by ~50 µm as compared to 190 µm for the conventional doping paste.

Experiment 2

Figure 5:
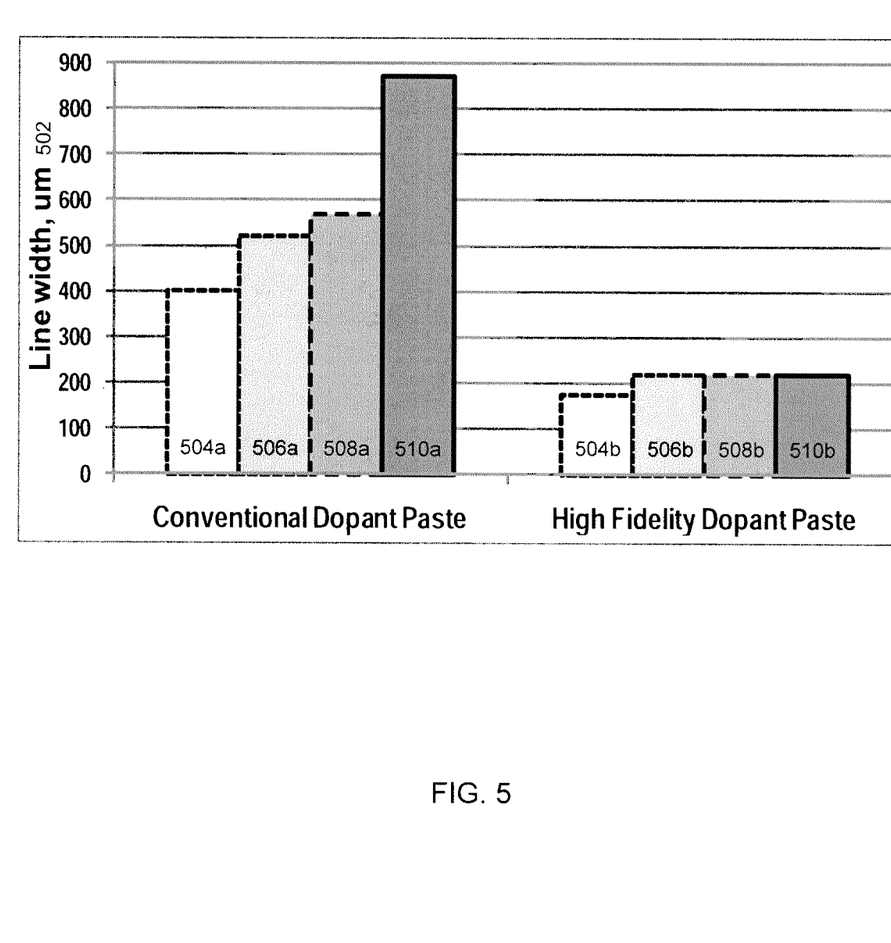
FIG. 5 compares line width between a conventional doping paste and an n-type high-fidelity doping paste, in accordance with the invention.

FIG. 5 compares the average line width at different stages of processing between a conventional (Ferro n-type) doping paste (see Matthew Edwards, y, Jonathan Bocking, Jeffrey E. Cotter and Neil Bennett; Prog. Photovolt: Res. Appl. 16 (1) pp 31-45, 2008) and an n-type high-fidelity doping paste on an ISO textured substrate, in accordance with the invention.

The conventional dopant paste was printed through a screen opening of 400 µm (504a) resulting in a printed line width of ~520 um (506a), then baked at 300° C. for a time period of 1-2 min in order to remove solvents and densify the deposited paste, resulting line width of about 570 µm (508a), an increase from the screen mask opening of about 40%. The conventional dopant paste was heated to a temperature of 950° C. for a time period of 90 min in order to diffuse the dopant into the substrate, resulting in a dopant width of about 870 µm (510a), or 217.5% of the original screen opening.

For the high fidelity doping paste, a screen mask opening of 175 µm (504b) was used to deposit the paste, resulting in a deposited width of about 220 µm (506b), an increase of about 20%. The conventional dopant paste was then baked at 200° C. for a time period of about 3 minutes in order to remove solvents and densify the deposited paste. However, the resulting line width remains about 20% larger than the screen opening (508b). The high fidelity dopant paste was then heated to a temperature of 950° C. for a time period of 90 min in order to diffuse the dopant into the substrate. As before, and unlike the conventional doping paste, the resulting line width remains at about 120% of the screen make opening (510b).

Doping Comparison

Figure 6:
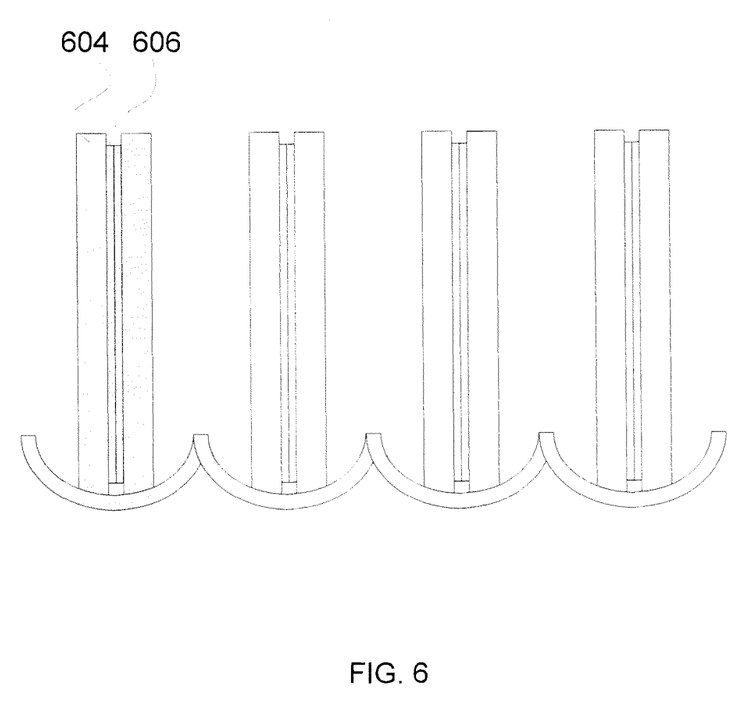
FIG. 6 shows a simplified diagram of a back-to-back dopant diffusion configuration for use with the high fidelity doping paste, in accordance with the invention.

FIG. 6 shows a simplified diagram of a back-to-back dopant diffusion configuration for use with the high-fidelity doping paste, in accordance with the invention Silicon substrates 604 are vertically positioned in a back-to-back configuration in order to minimize the effect of ambient dopant that becomes volatile from the doping paste during the doping environment. The p-type silicon substrates 604 were vertically placed back-to-back within a quartz tube in a horizontal diffusion furnace in order to cover the deposited Ferro doping paste and high-fidelity doping paste 606 (as appropriate) with a corresponding substrate in an with an $N_2$ ambient.

Experiment 3

Figure 7:
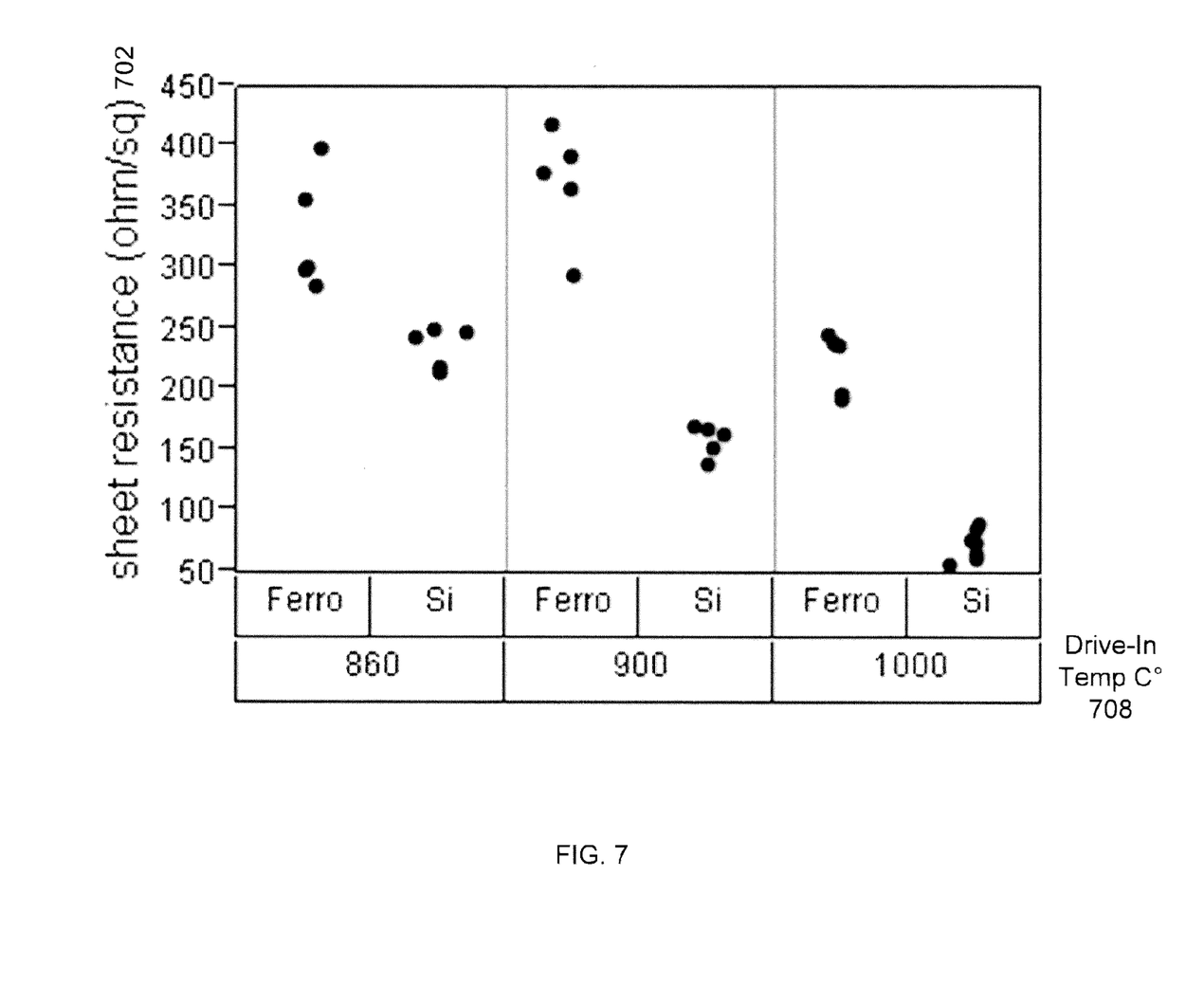
FIG. 7 compares the sheet resistance of a HF doping paste to a conventional n-type doping paste on a set of p-type silicon substrates, in accordance with the invention.

Referring now to FIG. 7, a simplified diagram comparing the sheet resistance of a HF doping paste to a Ferro n-type doping paste on a set of (2 ohm-cm/180 µm/saw damage etched) p-type silicon substrates, in accordance with the invention. The inventors believe that the doping profile Ferro doping paste is substantially similar to most doping pastes.

The high-fidelity doping paste was prepared by addition of 10% of phosphoric acid to Si nanoparticle paste containing 1.5 wt % ethyl cellulose binder and 8 wt % silicon nanoparticles in a terpineol solvent, followed by thorough mixing with a planetary mixer. The conventional (Ferro) doping paste was used unmodified. The set of p-type silicon substrates were each cleaned with a hydrofluoric acid/hydrochloric acid mixture prior to paste deposition.

The Ferro paste and the high-fidelity doping paste were each deposited on three separate substrate subsets. The substrate subset with the high-fidelity doping paste was then baked in $N_2$ ambient at 200° C. for 3 minutes to densify the film and to dehydrate the phosphoric acid. All substrate subsets where then heated in a quartz tube with an $N_2$ ambient for 30 minutes to drive in the phosphorous dopant: a first subset was heated to 860° C., a second subset was heated to 900° C., and a third subset was heated to 1000° C. All substrate subsets were then cleaned with a 10 minute BOE and the sheet resistance under ink regions was measured with a 4-point probe. In general, a 4-point probe determines the sample resistivity by supplying a high impedance current source through the outer two probes, and measuring voltage across the inner two probes.

At a drive-in temperature of 860° C., the sheet resistance of the substrate with Ferro paste is about 330 ohm/sq, while the sheet resistance of the substrate with HF doping paste is about 237 ohm/sq. At a drive-in temperature of 900° C., the sheet resistance of the substrate with Ferro paste is about 372 ohm/sq, while the sheet resistance of the substrate with HF doping paste is about 161 ohm/sq. And at a drive-in temperature of 1000° C., the sheet resistance of the substrate with Ferro paste is about 224 ohm/sq, while the sheet resistance of the substrate with HF doping paste is about 75 ohm/sq. As can be seen, for any given temperature, a lower sheet resistance and thus a higher dopant concentration is driven into the substrate.

Experiment 4

Figure 8:
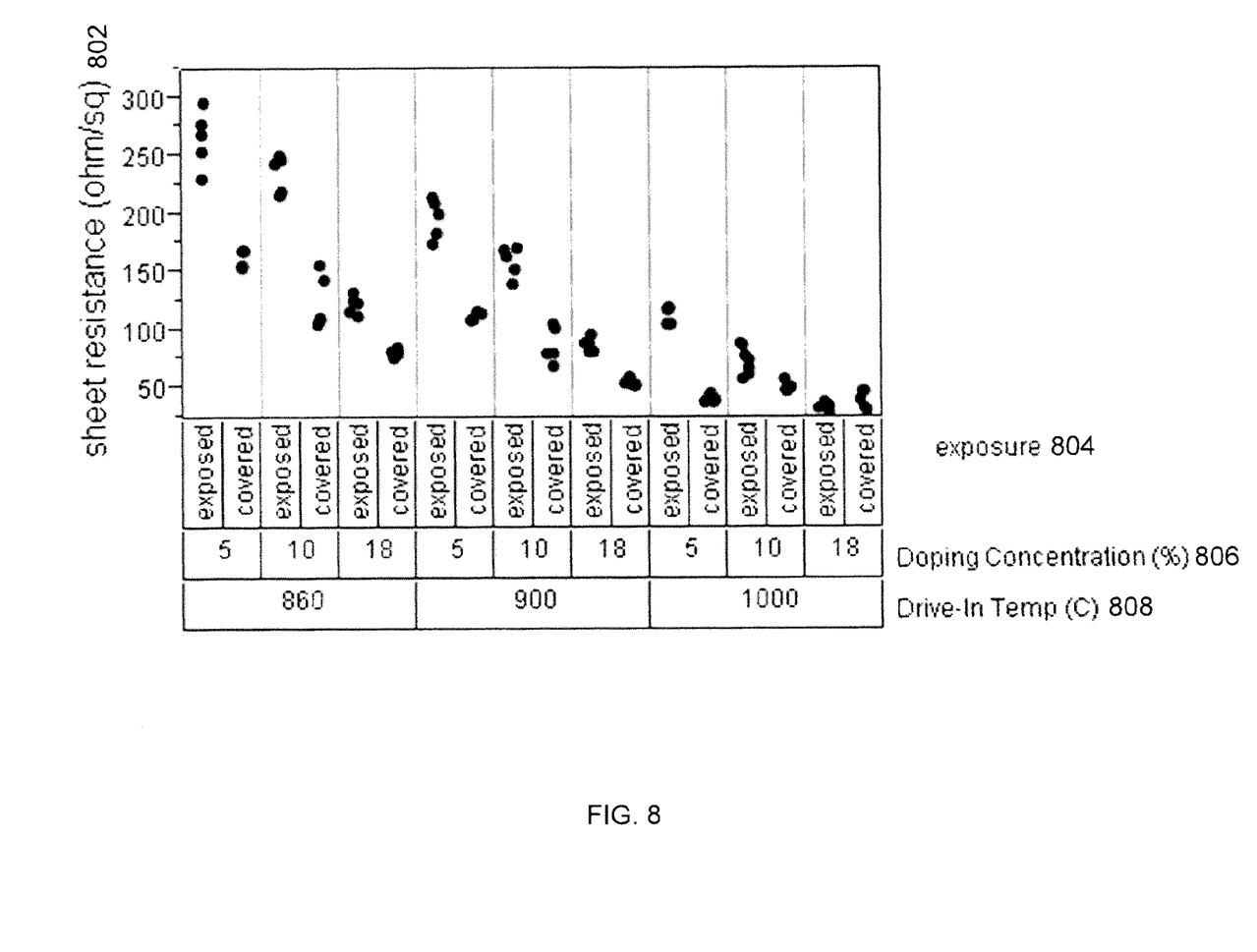
FIG. 8 compares the sheet resistance of various HF (phosphorous) doping paste configurations on a set of p-type silicon substrates, in accordance with the invention; and, FIGS. 9A-B compare the sheet resistance of various HF (boron) doping paste configurations on a set of n-type silicon substrates, in accordance with the invention.

Referring now to FIG. 8, a simplified diagram comparing the sheet resistance of various n-type high-fidelity doping paste configurations on a set of (2 ohm-cm/180 µm/saw damage etched) p-type silicon substrates, in accordance with the invention.

Sheet resistance (ohm/sq) 802 is shown along the vertical axis, while exposure 804, doping concentration % 806, and drive-in temperature (° C.) 808, are shown along the horizontal axis.

As previously described, high-fidelity doping paste was prepared by addition of 5, or 18% of phosphoric acid to Si nanoparticles paste containing 1.5 wt % ethyl cellulose binder and 8 wt % silicon nanoparticles in a terpineol solvent, followed by thorough mixing with a planetary mixer. The conventional (Ferro) doping paste was used unmodified.

The set of p-type silicon substrates were each cleaned with a hydrofluoric acid/hydrochloric acid mixture prior to paste deposition. The substrate subsets were then baked at 200° C. for 3 minutes to remove solvent. All substrate subsets were then heated in a quartz tube with an $N_2$ ambient to dehydrate the phosphoric acid and to drive in the phosphorous dopant. Covered wafers were placed in the heated quartz tube using the back-to-back configuration described in FIG. 6. Exposed wafers were placed in the heated quartz tube with ink areas directly exposed to the $N_2$ ambient.

At a drive-in temperature of 860° C., and a phosphorous doping concentration of 5%, the exposed sheet resistance of the substrate is about 267 ohm/sq, while the covered sheet resistance of the substrate is about 162 ohm/sq.

At a drive-in temperature of 860° C., and a phosphorous doping concentration of 10%, the exposed sheet resistance of the substrate is about 237 ohm/sq, while the covered sheet resistance of the substrate is about 127 ohm/sq.

At a drive-in temperature of 860° C., and a phosphorous doping concentration of 18%, the exposed sheet resistance of the substrate is about 126 ohm/sq, while the covered sheet resistance of the substrate is about 83 ohm/sq.

At a drive-in temperature of 900° C., and a phosphorous doping concentration of 5%, the exposed sheet resistance of the substrate is about 198 ohm/sq, while the covered sheet resistance of the substrate is about 112 ohm/sq.

At a drive-in temperature of 900° C., and a phosphorous doping concentration of 10%, the exposed sheet resistance of the substrate is about 160 ohm/sq, while the covered sheet resistance of the substrate is about 89 ohm/sq.

At a drive-in temperature of 900° C., and a phosphorous doping concentration of 18%, the exposed sheet resistance of the substrate is about 89 ohm/sq, while the covered sheet resistance of the substrate is about 57 ohm/sq.

At a drive-in temperature of 1000° C., and a phosphorous doping concentration of 5%, the exposed sheet resistance of the substrate is about 114 ohm/sq, while the covered sheet resistance of the substrate is about 42 ohm/sq.

At a drive-in temperature of 1000° C., and a phosphorous doping concentration of 10%, the exposed sheet resistance of the substrate is about 75 ohm/sq, while the covered sheet resistance of the substrate is about 52 ohm/sq.

At a drive-in temperature of 1000° C., and a phosphorous doping concentration of 18%, the exposed sheet resistance of the substrate is about 36 ohm/sq, while the covered sheet resistance of the substrate is about 41 ohm/sq.

As can be seen, for any given temperature, a lower sheet resistance and thus a higher dopant concentration is driven into the substrate.

Experiment 5

Figure 9A:
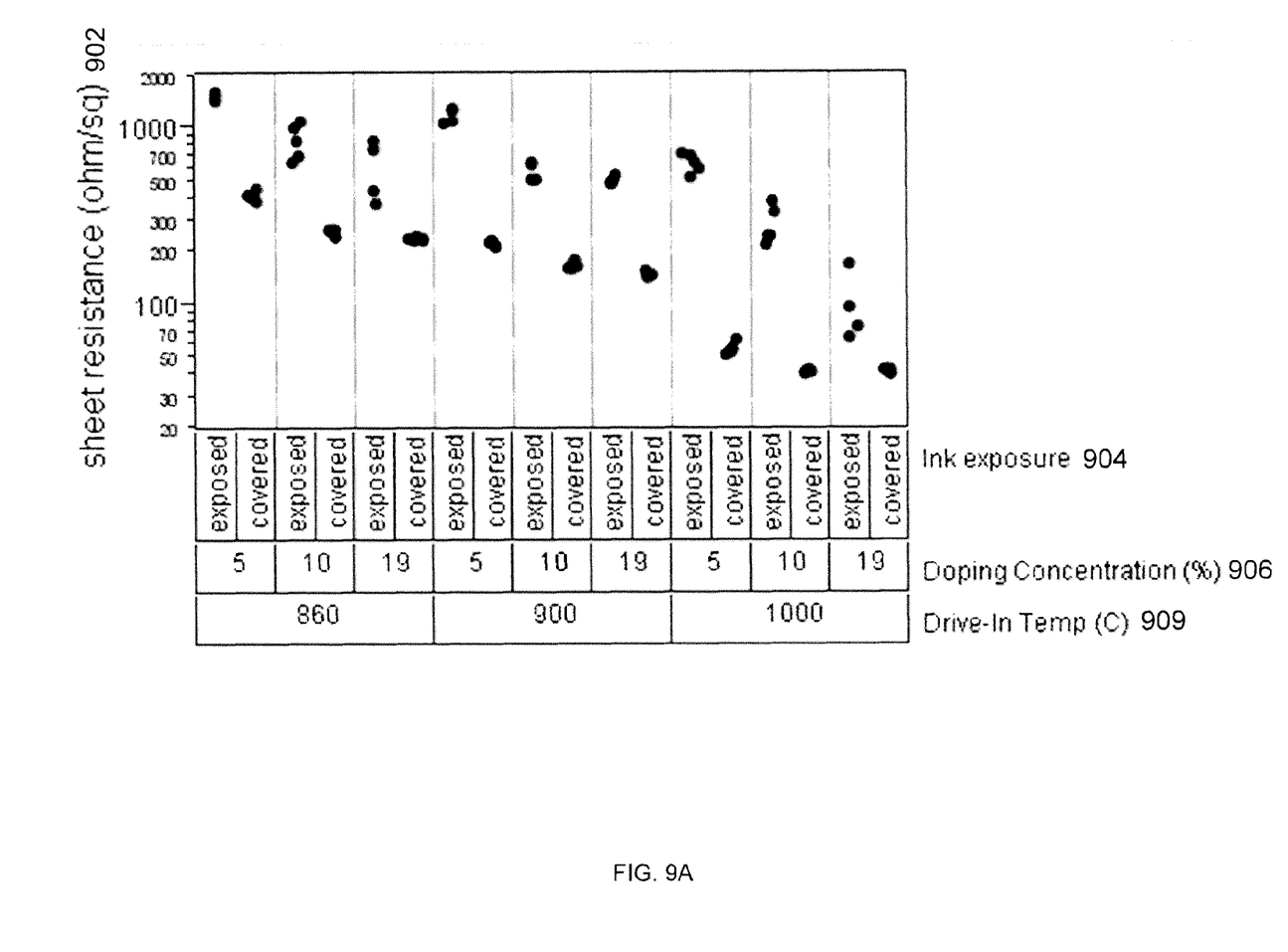
Figure 9B:
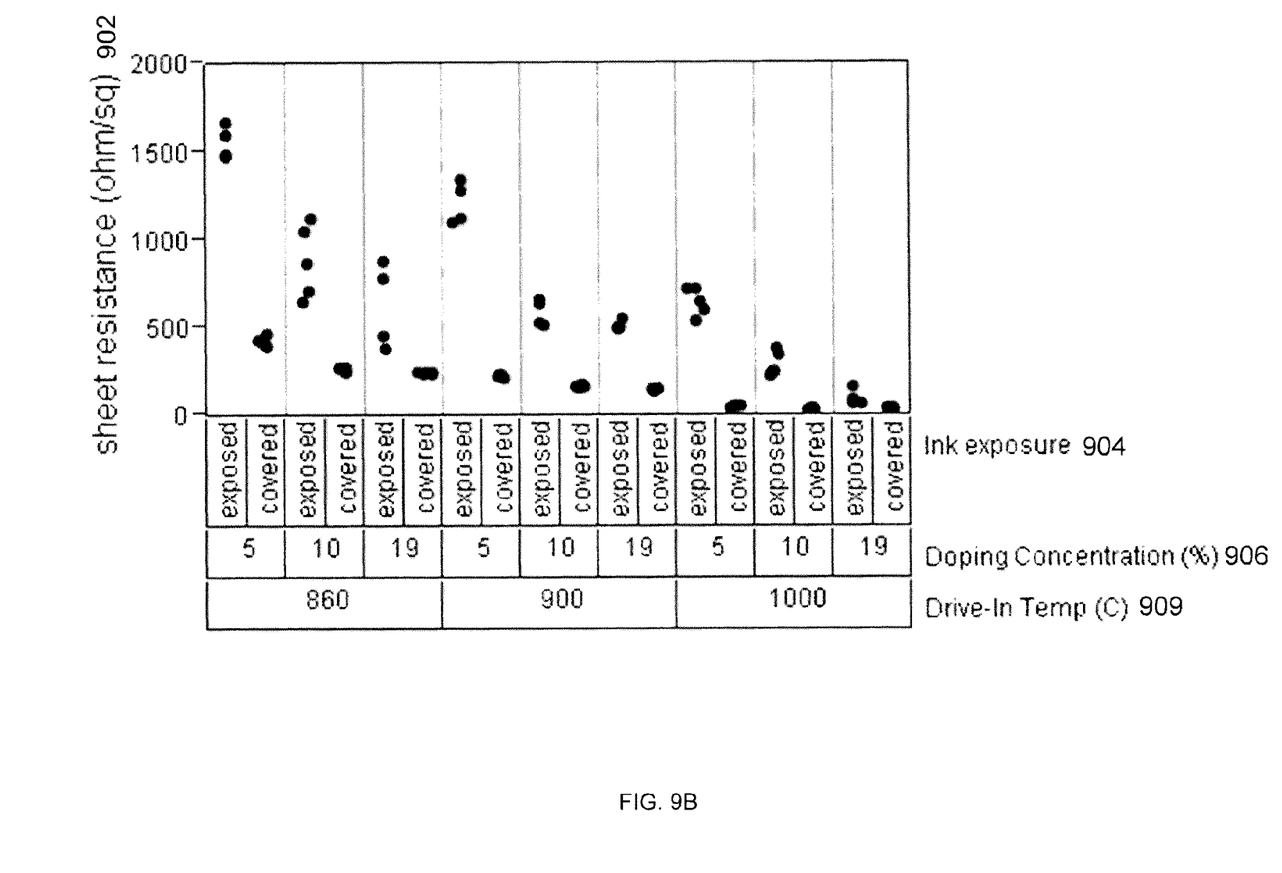

Referring now to FIGS. 9A-B, a set of simplified diagrams comparing the sheet resistance of various p-type (boron) high-fidelity doping paste configurations on a set of (2 ohm-cm/180 μm/saw damage etched) n-type silicon substrates, in accordance with the invention. FIG. 9A displays the data in on a logarithmic scale, while FIG. 9B displays the data on a linear scale.

Sheet resistance (ohm/sq) 902 is shown along the vertical axis, while exposure 904, doping concentration % 906, and drive-in temperature (° C.) 908, are shown along the horizontal axis.

The high-fidelity doping paste was prepared by addition of 5, 10 or 19% of Triethyl borate to Si nanoparticles paste containing 1.5 wt % ethyl cellulose binder and 8 wt % silicon nanoparticles in a terpineol solvent, followed by thorough mixing with a planetary mixer.

Three high-fidelity doping paste boron concentrations where prepared (5%, 10%, and 19%). The set of n-type silicon substrates were each cleaned with a hydrofluoric acid/hydrochloric acid mixture prior to paste deposition. The substrate subsets where then baked in $N_2$ ambient at 200° C. for 3 minutes to densify the films. All substrate subsets where then heated in a quartz tube with an $N_2$ ambient for 30 minutes to drive in the boron dopant.

At a drive-in temperature of 860° C., and a boron doping concentration of 5%, the exposed sheet resistance of the substrate is about 1588 ohm/sq, while the covered sheet resistance of the substrate is about 431 ohm/sq.

At a drive-in temperature of 860° C., and a boron doping concentration of 10%, the exposed sheet resistance of the substrate is about 889 ohm/sq, while the covered sheet resistance of the substrate is about 268 ohm/sq.

At a drive-in temperature of 860° C., and a boron doping concentration of 19%, the exposed sheet resistance of the substrate is about 629 ohm/sq, while the covered sheet resistance of the substrate is about 247 ohm/sq.

At a drive-in temperature of 900° C., and a boron doping concentration of 5%, the exposed sheet resistance of the substrate is about 1232 ohm/sq, while the covered sheet resistance of the substrate is about 231 ohm/sq.

At a drive-in temperature of 900° C., and a boron doping concentration of 10%, the exposed sheet resistance of the substrate is about 603 ohm/sq, while the covered sheet resistance of the substrate is about 171 ohm/sq.

At a drive-in temperature of 900° C., and a boron doping concentration of 19%, the exposed sheet resistance of the substrate is about 520 ohm/sq, while the covered sheet resistance of the substrate is about 154 ohm/sq.

At a drive-in temperature of 1000° C., and a boron doping concentration of 5%, the exposed sheet resistance of the substrate is about 653 ohm/sq, while the covered sheet resistance of the substrate is about 58 ohm/sq.

At a drive-in temperature of 1000° C., and a boron doping concentration of 10%, the exposed sheet resistance of the substrate is about 297 ohm/sq, while the covered sheet resistance of the substrate is about 43 ohm/sq.

At a drive-in temperature of 1000° C., and a boron doping concentration of 19%, the exposed sheet resistance of the substrate is about 105 ohm/sq, while the covered sheet resistance of the substrate is about 43 ohm/sq.

As can be seen, for any given temperature, a lower sheet resistance and thus a higher dopant concentration is driven into the substrate.

The inventions illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed.

Thus, it should be understood that although the present invention has been specifically disclosed by preferred embodiments and optional features, modification, improvement and variation of the inventions herein disclosed may be resorted to by those skilled in the art, and that such modifications, improvements and variations are considered to be within the scope of this invention. The materials, methods, and examples provided here are representative of preferred embodiments, are exemplary, and are not intended as limitations on the scope of the invention.

As will be understood by one skilled in the art, for any and all purposes, particularly in terms of providing a written description, all ranges disclosed herein also encompass any and all possible sub-ranges and combinations of sub-ranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into sub-ranges as discussed above. In addition, the terms "dopant or doped" and "counter-dopant or counter-doped" refer to a set of dopants of opposite types. That is, if the dopant is p-type, then the counter-dopant is n-type. Furthermore, unless otherwise dopant-types may be switched. In addition, the silicon substrate may be either mono-crystalline or multi-crystalline. In addition, "undoped" refers to a material with a lack of dopant. As described herein, the ketone molecules and the alcohol molecules may be cyclic, straight, or branched.

Furthermore, this invention may be applied to other solar cell structures as described in U.S. patent application Ser. No. 12/029,838, entitled Methods and Apparatus for Creating Junctions on a Substrate, filed Feb. 12, 2008, the entire disclosure of which is incorporated by reference.

All publications, patent applications, issued patents, and other documents referred to in this specification are herein incorporated by reference as if each individual publication, patent application, issued patent or other document were specifically and individually indicated to be incorporated by reference in its entirety. Definitions that are contained in text incorporated by reference are excluded to the extent that they contradict definitions in this disclosure.

For the purposes of this disclosure and unless otherwise specified, "a" or "an" means "one or more." All patents, applications, references and publications cited herein are incorporated by reference in their entirety to the same extent as if they were individually incorporated by reference. In addition, the word set refers to a collection of one or more items or objects.

Advantages of the invention include a high fidelity doping paste, optimized for screen printing in the high-volume manufacture of solar cells.

Having disclosed exemplary embodiments and the best mode, modifications and variations may be made to the disclosed embodiments while remaining within the subject and spirit of the invention as defined by the following claims.

What is claimed is:

1. A dopant paste consisting of:
   a solvent;
   a set of non-glass matrix particles dispersed into the solvent;
   10-19 wt % of a dopant, and
   optionally a binder,
   wherein the set of non-glass matrix particles is a set of ceramic particles selected from the group consisting of $Al_2O_3$, MgO, $CeO_2$, $TiO_2$, ZnO, $ZrO_2$, $ZrO_{2-3}$, and $Y_2O_3$,
   wherein the dopant is selected from the group consisting of phosphorous dopant, arsenic dopant, antimony dopant, boron dopant and gallium dopant.

2. The dopant paste of claim 1, wherein the solvent is an organic solvent with boiling point greater than about 200° C.

3. The dopant paste of claim 1, wherein the solvent is selected from the group consisting of a solvent with a linear or cyclic structure, a solvent with saturated or unsaturated hydrocarbon parts, a hydrocarbon-based solvent, an alcohol, a thiol, an ether, an ester, an aldehyde, a ketone, and combinations thereof.

4. The dopant paste of claim 1 the binder is present in the paste.

5. The dopant paste of claim 4, wherein the binder is a polymer soluble in the organic solvent.

6. The dopant paste of claim 4, wherein the binder is one of a polyacrylate, a polyacetal, a polyvinyl, a cellulose, and copolymers thereof.

7. The dopant paste of claim 1, wherein the dopant is one of an n-type dopant precursor and a p-type dopant precursor.

8. The dopant paste of claim 7, wherein the n-type dopant precursor is one of an n-type liquid, an n-type solid, and an n-type polymer.

9. The dopant paste of claim 8, where in n-type liquid is one of $H_3PO_4$ and organophosphate.

10. The dopant paste of claim 8, wherein n-type solid is one of $P_2O_5$, $Na_3PO_4$, $AlPO_4$, AlP, and $Na_3P$.

11. The dopant paste of claim 8, wherein n-type polymer is one of a polyphosphonate and a polyphosphazenes.

12. The dopant paste of claim 7, wherein the p-type dopant precursor is one of a p-type liquid, a p-type solid, a p-type binary compound, and a p-type polymer.

13. The dopant paste of claim 12, wherein the p-type liquid is $B(OR)_3$.

14. The dopant paste of claim 12, wherein the p-type solid is one of $B(OH)_3$, $NaBO_2$, $Na_2B_4O_7$, and $B_2O_3$.

15. The dopant paste of claim 12, wherein the p-type binary compound is one of boronitride, boron carbide, boron silicides and elementary boron.

16. The dopant paste of claim 12, wherein the p-type polymer is one of a polyborazole, and a organoboron-silicon.

17. The doping paste of claim 1, wherein the average diameter of the set of the non-glass matrix particles is less than 25 microns.

18. The doping paste of claim 1, wherein the set of non-glass matrix particles is a set of ceramic particles selected from the group consisting of $TiO_2$ and $ZrO_2$.

19. A doping method comprising:
   depositing the paste of claim 1 on a surface of a semiconductor substrate.

20. The doping method of claim 19, wherein the semiconductor substrate is a silicon substrate.

* * * * *